US010145917B2

(12) United States Patent
Seiberlich et al.

(10) Patent No.: US 10,145,917 B2
(45) Date of Patent: Dec. 4, 2018

(54) MULTI-COMPONENT VOXEL SEPARATION USING MAGNETIC RESONANCE FINGERPRINTING WITH COMPARTMENT EXCHANGE

(71) Applicant: Case Western Reserve University, Cleveland, OH (US)

(72) Inventors: Nicole Seiberlich, Shaker Heights, OH (US); Jesse Hamilton, Cleveland, OH (US); Mark Griswold, Shaker Heights, OH (US)

(73) Assignee: Case Western Reserve University, Cleveland, OH (US)

(*) Notice: Subject to any disclaimer, the term of this patent is extended or adjusted under 35 U.S.C. 154(b) by 377 days.

(21) Appl. No.: 14/932,100

(22) Filed: Nov. 4, 2015

(65) Prior Publication Data
US 2016/0282434 A1 Sep. 29, 2016

Related U.S. Application Data

(60) Provisional application No. 62/139,094, filed on Mar. 27, 2015.

(51) Int. Cl.
*G01R 33/50* (2006.01)
*G01R 33/483* (2006.01)
*G01R 33/56* (2006.01)
*G01R 33/561* (2006.01)

(52) U.S. Cl.
CPC ........ *G01R 33/50* (2013.01); *G01R 33/483* (2013.01); *G01R 33/5602* (2013.01); *G01R 33/5613* (2013.01)

(58) Field of Classification Search
CPC .. G01R 33/50; G01R 33/483; G01R 33/5602; G01R 33/5613
See application file for complete search history.

(56) References Cited

U.S. PATENT DOCUMENTS

| | | | |
|---|---|---|---|
| 2012/0235678 A1* | 9/2012 | Seiberlich | G01R 33/56 324/307 |
| 2013/0265047 A1* | 10/2013 | Griswold | G01R 33/56 324/309 |
| 2014/0103924 A1* | 4/2014 | Griswold | G01R 33/561 324/309 |
| 2016/0278661 A1* | 9/2016 | Griswold | A61B 5/055 |
| 2016/0282430 A1* | 9/2016 | Gulani | G01R 33/4828 |

* cited by examiner

Primary Examiner — Rodney Bonnette
(74) Attorney, Agent, or Firm — Quarles & Brady LLP

(57) ABSTRACT

Example embodiments associated with characterizing a sample using NMR fingerprinting are described. One example NMR apparatus includes an NMR logic that repetitively and variably samples a (k, t, E) space associated with an object to acquire a set of NMR signals that are associated with different points in the (k, t, E) space. Sampling is performed with t and/or E varying in a non-constant way. The NMR apparatus may also include a signal logic that produces an NMR signal evolution from the NMR signals and a characterization logic that characterizes a tissue in the object as a result of comparing acquired signals to reference signals. Example embodiments facilitate analyzing voxels having multiple compartments that may experience magnetic exchange. The compartments may be, for example, an intracellular volume and an extracellular volume in a tissue that experiences magnetic exchange due to the movement of water between the volumes.

37 Claims, 13 Drawing Sheets

MULTI-COMPONENT VOXEL SEPARATION USING MAGNETIC RESONANCE FINGERPRINTING WITH COMPARTMENT EXCHANGE

CROSS REFERENCE TO RELATED APPLICATIONS

This application claims priority to U.S. Provisional Patent Application 62/139,094 filed Mar. 27, 2015.

FEDERAL FUNDING NOTICE

The invention was made with government support under the grant(s) EB011527 and EB016728 awarded by the National Institutes of Health. The government has certain rights in the invention.

BACKGROUND

Conventional magnetic resonance imaging (MRI) can produce relaxation parameter maps. The relaxation parameter maps are produced from nuclear magnetic resonance (NMR) signals produced in response to NMR excitation. The NMR signals may be produced by sensitizing an MRI signal to either T1 (spin-lattice) relaxation or T2 (spin-spin) relaxation, waiting a variable amount of time, and then collecting the resulting NMR signals. Conventionally, single voxels have been assumed to comprise only a single tissue type having a single T1 value and a single T2 value. In this conventional approach, the acquired signal time course follows an exponential recovery or decay. The acquired signal time course may thus be fit to an exponential model to calculate a value for the relaxation parameter (e.g., T1, T2) in the voxel. This operation may be performed for each voxel when producing a relaxation parameter map. Conventional quantitative relaxation parameter map production requires a significant time to elapse between NMR excitation and NMR signal acquisition to sample the recovery or delay curves. For example, delays of up to several seconds are common in T1 mapping. This delay may make it difficult, if even possible at all, to distinguish signals from multiple compartments in a volume.

Conventional approaches that assume that a single voxel will produce a single exponential recovery or decay may be challenged when a voxel contains two different compartments having different relaxation characteristics or when a voxel has a single compartment that has two components that experience exchange. The approach may be challenged even further to account for different situations that produce different results. For example, when different compartments have no magnetic exchange between them, the relaxation signal may be bi-exponential. However, when different compartments have magnetic exchange between compartments, then the resulting signal evolution may follow a time course that is dictated by a mixture of the relaxation parameters. If the exchange is fast relative to the experiment, then the relaxation parameter value in the single voxel may be described according to:

$$\frac{1}{T_{1,c}} = \frac{\rho_A}{T_{1,A}} + \frac{\rho_B}{T_{1,B}}$$

or

-continued $$\frac{1}{T_{2,c}} = \frac{\rho_A}{T_{2,A}} + \frac{\rho_B}{T_{2,B}}$$

where:
$T_{1,A}$ is the T1 value for the water in compartment A,
$T_{2,A}$ is the T2 value for the water in compartment A,
$T_{1,B}$ is the T1 value for the water in compartment B,
$T_{2,B}$ is the T2 value for the water in compartment B,
ρA is the relative volume fraction of compartment A, and
ρB is the relative volume fraction of compartment B.

In conventional approaches, when the magnetic exchange between compartments is slower and occurs on a timescale on the same order of magnitude as the experimental time, then the exchange will affect the observed relaxation value. For example, in a conventional T1 mapping experiment, an exchange rate of approximately 8.3 s$^{-1}$ between compartments with T1 and T2 values of 350 ms/1400 ms and 30 ms/120 ms, and relative volume fractions of 25% and 75% will produce an effective mono-exponential relaxation value of 1020 ms. The exchange rate of approximately 8.3 s$^{-1}$ corresponds to a mean extracellular residence time of 120 ms. T1 and T2 values of 350 ms/1400 ms and 30 ms/120 ms and relative volume fractions of 25% and 75% are observed in myocardial tissue.

FIG. 1 illustrates a volume 190 having two compartments between which magnetic exchange occurs. A first volume 100 may be, for example, an extracellular volume and a second volume 110 may be, for example, an intracellular volume. The intracellular volume 110 and the extracellular volume 100 may be present in tissues including, for example, a myocardial tissue. Molecules, chemicals, or spins may move between the first volume 100 and the second volume 110 causing magnetization exchange between the two volumes. For example, water molecules 112 and 114 may move from the second volume 110 into the first volume 100 while water molecules 102 and 104 may move from the first volume 100 into the second volume 110.

Resonant species in extracellular volume 100 may have a first set of properties (e.g., T1$_{extra}$, T2$_{extra}$). Resonant species in intracellular volume 110 may have a second set of properties (e.g., T1$_{intra}$, T2$_{intra}$). Conventionally, MRI has been unable to distinguish T1$_{intra}$ from T1$_{extra}$ and thus a T1 signal from the entire volume 190 that included the intracellular volume 110 and the extracellular volume 100 may have been a combination of T1$_{intra}$ and T1$_{extra}$. While the intracellular volume 110 is illustrated entirely inside the extracellular volume 100, other arrangements of sub-volumes are possible.

Characterizing resonant species using NMR can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting (MRF), which is described in *Magnetic Resonance Fingerprinting*, Ma D et al., Nature 2013:495, (7440):187-192.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
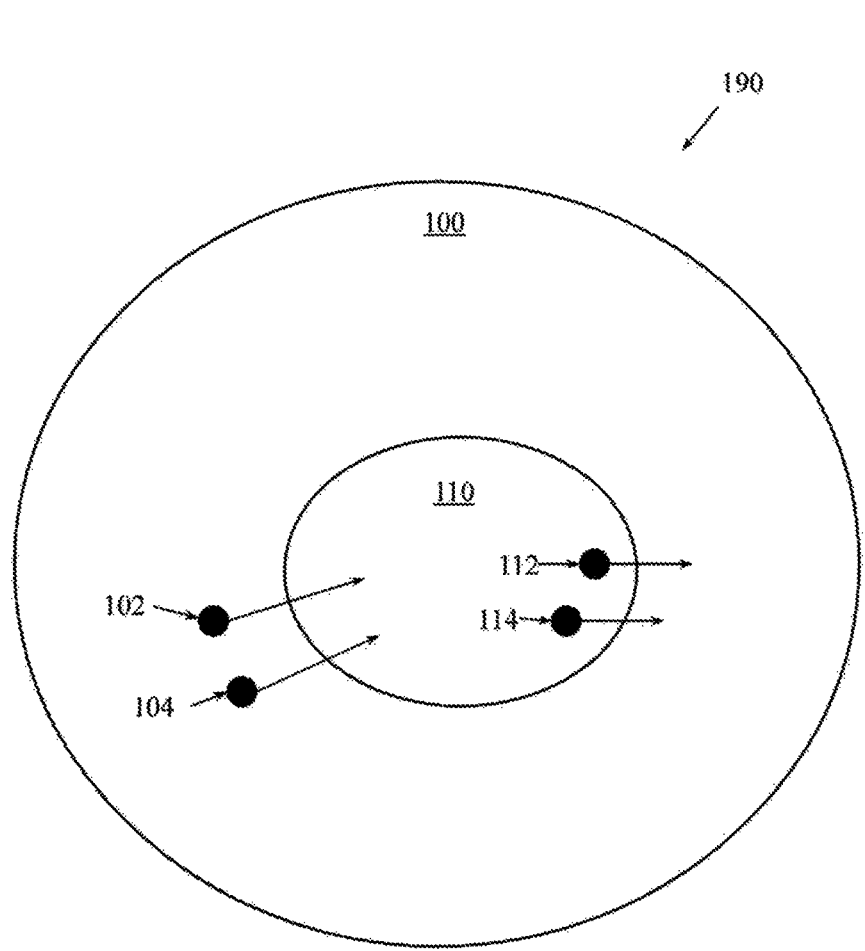
FIG. 1 illustrates a voxel having multiple compartments.

MRF provides a new paradigm for MRI acquisition and reconstruction. MRF also provides new opportunities for quantitative analysis of acquired data. MRF facilitates rapid, efficient, and simultaneous quantification of multiple tissue properties. Example apparatus and methods use MRF to analyze voxels with a single compartment and voxels made up of multiple (e.g., two) compartments by explicitly modeling the effects of magnetic exchange between compartments. The magnetic exchange may occur as chemicals (e.g., water) move between the two compartments. The example apparatus and methods that use MRF to quantify or otherwise examine the effects of magnetic exchange may be referred to as exchange MRF, or MRF-X. In one embodiment, exchange may occur between two components in a single compartment.

MRF-X facilitates measuring properties (e.g., T1, T2) of two or more compartments in a volume, even when the compartments are experiencing magnetic exchange. The magnetic exchange may occur as a result of, for example, water moving between the two compartments. In one embodiment, MRF-X facilitates measuring properties of both intracellular and extracellular regions in myocardial tissue. Rather than assuming that each voxel in a volume analyzed by MRF-X contains a single homogeneous tissue as in standard MRI, MRF-X considers that a voxel may have multiple (e.g., two) compartments (e.g., intracellular and extracellular space). MRF-X also considers that water molecules may be exchanging between the compartments in dynamic equilibrium. Different compartments may have their own magnetic relaxation properties (e.g., T1, T2), a magnetic exchange rate constant, and a volume fraction. Conventional tissue property mapping does not observe these compartmental values but rather observes a single combined, or "apparent" T2 and T2 that are a nonlinear function of the compartment relaxation values and the exchange rate. The volume fraction $\varphi_i$ may be defined as the volume of a constituent Vi divided by the volume of all constituents of the mixture V according to:

$$\varphi_i = \frac{V_i}{\sum_j V_j}$$

When analyzing biological materials (e.g., tissues) using conventional MRI, exchange between compartments may occur much faster than the rate at which images are collected. However, with MRF-X, images may be acquired at rates up to, for example, every 5-20 ms, making MRF-X more sensitive to exchange and thus able to quantify magnetic relaxation properties (e.g., T1, T2) for the separate compartments individually. In one embodiment, MRF-X facilitates quantifying ECV in a single scan without contrast agent. With data being acquired in the time scale of the magnetic exchange, MRF-X takes magnetic exchange effects into account to generate voxel-wise maps of ECV and T1.

MRF-X facilitates quantifying the T1 or T2 values for voxels having multiple compartments that may experience magnetization exchange. The compartments may be, for example, intracellular and extracellular spaces. In one embodiment, the intracellular and extracellular spaces may be in myocardial tissue. MRF-X also facilitates quantifying relative volume fractions and the exchange rate between compartments. Like conventional MRI, MRF-X uses the complex signal behavior in MRI when radio frequency (RF) pulses with irregular separations and magnitudes are employed. Example MRF-X pulse sequences are designed to generate time courses that are affected by different MRI contrast parameters simultaneously, including T1 and T2. For complex signal time courses, knowledge of the timing of the MRF-X pulse sequence facilitates using the Bloch equations to numerically derive various time courses that would occur for physiologically relevant T1 and T2 combinations. An actual time course is then compared to time courses in a dictionary to find a match. Actual T1 and T2 parameters are then retrieved for the matched time course.

In MRF-X, a pulse sequence can be designed to amplify signal differences that are related to exchange between compartments with different relaxation parameters. In one embodiment, a pulse sequence can be designed to amplify signal differences that are related to exchange between components in a single compartment. Bloch-McConnell equations may be used in place of the Bloch equations to model the signal. The Bloch-McConnell equations consider the magnetic exchange when calculating the MRI signal evolution. Example apparatus and methods may employ a dictionary populated with data produced by Bloch-McConnell equations using various T1 values, various T2 values, various volume fractions, and various exchange rates between compartments or components.

In one experiment, signal evolutions were simulated using the Bloch-McConnell equations for two pools with $T1_{extra}=350$ ms. $T2_{extra}=30$ ms. $T1_{intra}=1400$ ms, and $T2_{intra}$=120 ms. Four tissues were simulated with ECV values of 25% and 50%, and moderate (k=8.3 s$^{-1}$) or fast (k=1000 s$^{-1}$) exchange. A standard inversion recovery spin echo experiment was simulated with TE=50 ms, TI ranging from 20-3000 ms, and complete relaxation between measurements. The signal was then used to fit apparent mono-exponential T1 values to mimic native T1 mapping. Additionally, an MRF-X sequence with 500 measurements containing pseudorandom flip angles (0-70 deg) and acquisition times (TRs) (9-12 ms) was simulated. A sensitivity analysis was performed by creating a dictionary with the following parameters: $T1_{intra}$ and $T1_{extra}$ 100-2000 ms, exchange rate 1-10 s$^{-1}$, and ECV 0-100% ($T2_{extra}$=30 ms and $T2_{intra}$=120 ms were fixed). Noise was added to a randomly selected signal evolution before matching it back to the dictionary. This process was repeated for 1000 entries and signal-to-noise (SNR) levels of 5-100, and the relative error for each parameter was computed as (estimated-actual)/actual. SNR was defined as the maximum in the signal evolution divided by the noise standard deviation.

Figure 2:
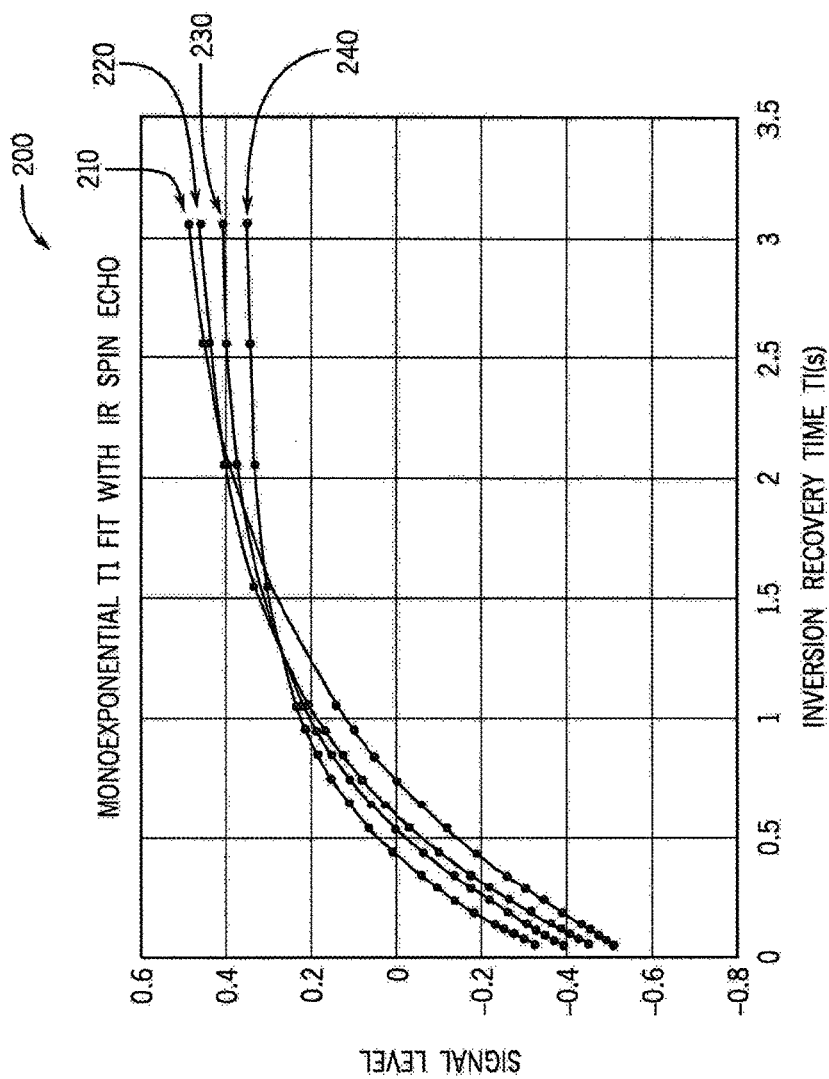
FIG. 2 illustrates mono-exponential T1 values fit from a conventional spin echo inversion recovery sequence.

FIG. 2 shows mono-exponential fits for T1 from the experiment using a standard spin echo inversion recovery sequence. Although two compartments are present, a single effective T1 is observed that is different from intracellular or extracellular T1 and varies with exchange rate.

FIG. 2 illustrates the results 200 of simulated inversion experiments. FIG. 2 illustrates mono-exponential fits for T1 for four cases for which conventional MRI was performed using an inversion recovery (IR) spin echo approach. An inversion recovery experiment was simulated using the discrete time Bloch-McConnell equations using inversion times between 20 ms and 3000 ms with complete relaxation between acquisitions and an echo time of 50 ms. In the example experiment, the signal that simulated two pools with exchange was fit to a mono-exponential relaxation as per conventional T1 mapping experiments. In this conventional example, T1 measurements are for the entire volume and cannot be separated into multiple compartments. Thus, the T1 measurements are a blend of the T1 for the different compartments.

Different combinations of volume fractions and exchange rates produced different mono-exponential relaxation. Curve 210 is associated with an ECV of 25% and an exchange rate of 8.2 s$^{-1}$. In this example, the T1 fit was at 1020 ms. Curve 220 is associated with an ECV of 25% and an exchange rate of 1000 s$^{-1}$. In this example, the T1 fit was at 800 ms. Curve 230 is associated with an ECV of 50% and an exchange rate of 8.3 s$^{-1}$. In this example, the T1 fit was at 713 ms. Curve 240 is associated with an ECV of 50% and an exchange rate of 1000 s$^{-1}$. In this example, the T1 fit was at 560 ms.

FIG. 2 illustrates good fits for T1 values even though two compartments with different T1 values were present. For the fast exchange regime, the T1 values are those expected from the fast exchange relaxation equation provided above. However, with moderate exchange, a mono-exponential is also observed. Conventionally, it may have been difficult, if even possible at all, to distinguish the mono-exponential signal associated with moderate exchange from a signal that would be produced from either a single voxel component or from different components having the fast exchange regime with different compartmental T1 values. This has made it difficult, if even possible at all, to observe two compartments in conventional T1 mapping experiments unless there is negligible exchange between the two compartments on the exponential timescale. Even moderate exchange can lead to an improper estimation of the composite T1.

Figure 3:
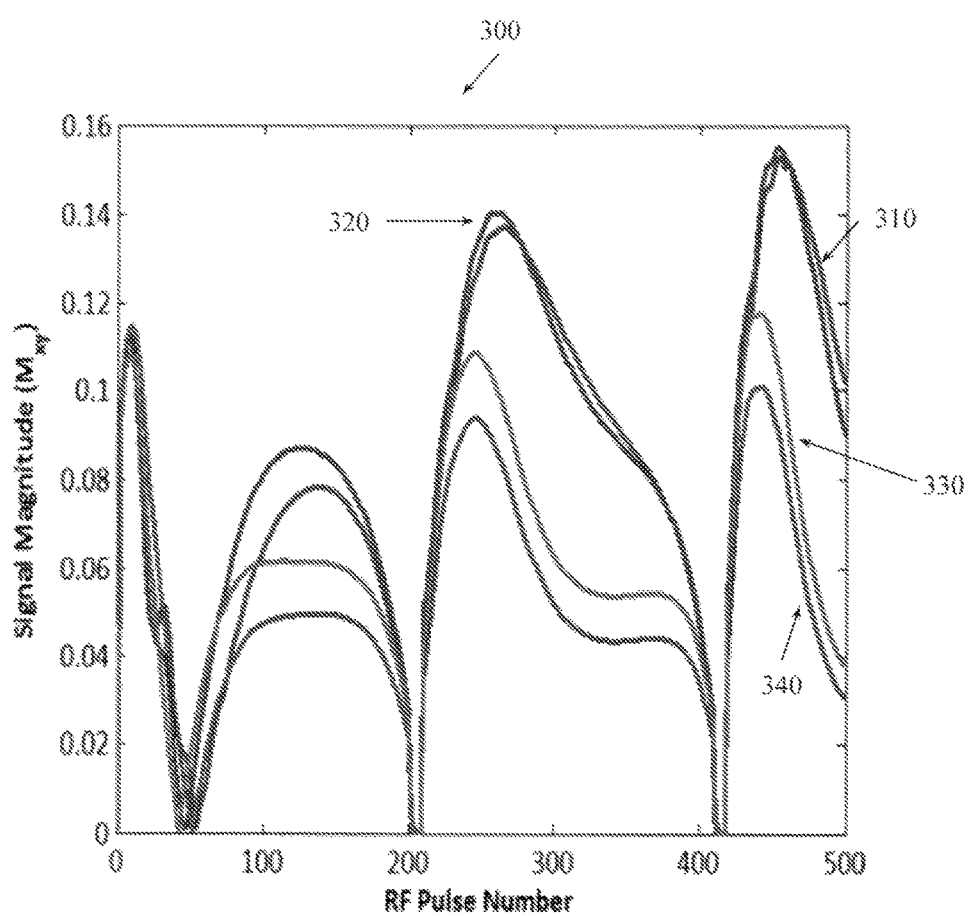
FIG. 3 illustrates magnetic resonance fingerprinting with compartment exchange (MRF-X) signal evolutions for a sequence with 500 measurements and pseudorandom flip angles (0-70 degrees) and TRs (9-12 ms).

FIG. 3 shows MRF-X signal evolutions from the experiment for two-compartment voxels with exchange, as well as single compartment voxels having the effective T1 determined by IR spin echo. In this MRF-X example, T1 measurements can be distinguished for the multiple compartments. The signal evolutions are distinguishable with MRF-X but not with standard T1 mapping. Compare the results in FIG. 3 with the results for the same cases in FIG. 2. Curve 310 is associated with an ECV of 25% and an exchange rate of 8.2 s$^{-1}$. Curve 320 is associated with an ECV of 25% and an exchange rate of 1000 s$^{-1}$. Curve 330 is associated with an ECV of 50% and an exchange rate of 8.3 s$^{-1}$. Curve 340 is associated with an ECV of 50% and an exchange rate of 1000 s$^{-1}$. Unlike FIG. 2, where the signal evolutions were the result of a combination of T1 values from two compartments and had the same appearance as signal evolutions that would arise from a single compartment, in FIG. 3, the signal evolutions resulting from the existence of two compartments with different T1 values are different from signal evolutions arising from a single T1 value.

Figure 4:
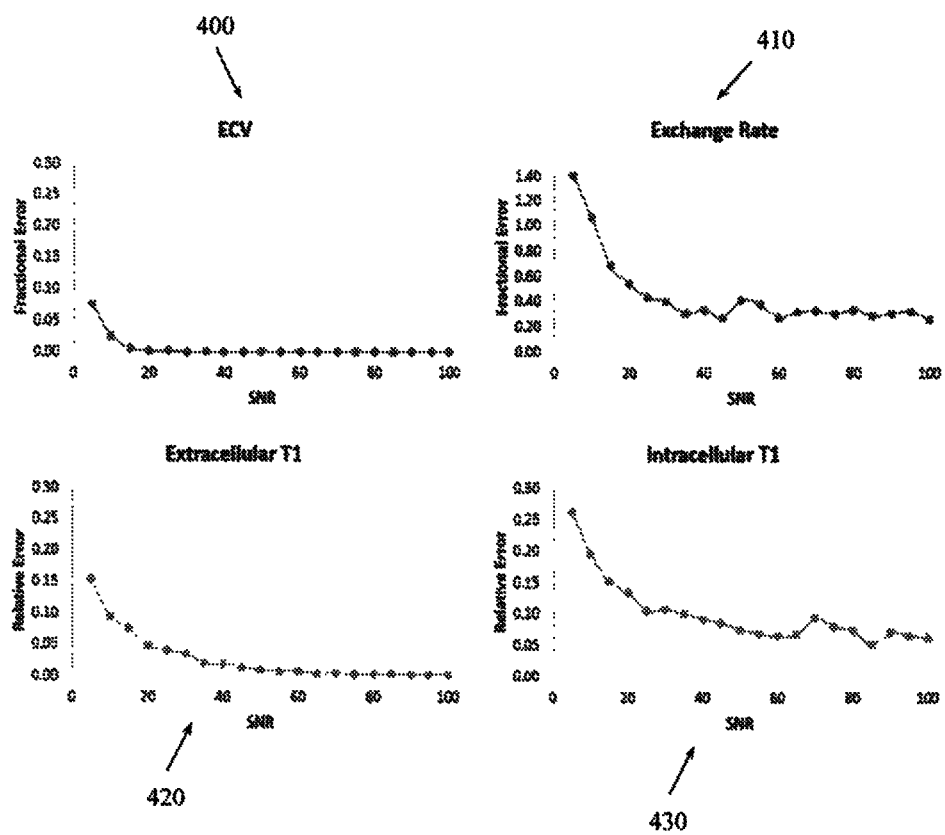
FIG. 4 illustrates MRF-X sensitivity to extracellular volume (ECV), exchange rate, extracellular T1, and intracellular T1.

FIG. 4 illustrates the results of a sensitivity analysis associated with MRF-X of a volume that includes voxels having two compartments (e.g., intracellular space, extracellular space) that are experiencing magnetization exchange as a result of water exchange. A first compartment may be referred to as compartment A while a second compartment may be referred to as compartment B. The results in FIG. 4 are associated with an MRF-X dictionary that was created with the following parameter ranges:

$T1_A$ 100-2000 ms
$T1_B$ 100-2000 ms
Exchange rate 1-10 s$^{-1}$
Volume fraction of species A 0-100%
$T2_A$ 30 ms
$T2_B$ 120 ms Graph 400 shows that MRF-X displays good sensitivity to ECV. Graph 410 shows that MRF-X displays good sensitivity to exchange rate. Graph 430 shows that MRF-X displays good sensitivity to intracellular T1. Graph 420 shows that MRF-X displays good sensitivity to extracellular T1, with 10% relative error or less for both parameters above SNR=20. Some sequences may be sensitive to exchange rate with errors below 40% at SNR=30 and 25% at SNR=100. In the experimental sensitivity analysis, noise was added to a randomly selected signal evolution before matching the signal evolution back to the dictionary. In the experimental sensitivity analysis, the process was repeated for 1000 entries using SNR of 5-100. The relative error for each parameter was computed as (estimated-actual)/actual. SNR was defined as the maximum in the signal evolution divided by the noise standard deviation.

MRF-X facilitates quantifying subvoxel T1, T2, volume fractions, and exchange rate when magnetic exchange is present. Quantification of myocardial extracellular volume fraction, which is useful in evaluating fibrotic disease, is typically calculated indirectly using pre-contrast and post-contrast T1 measurements of blood and myocardium. However, MRF-X facilitates measuring ECV directly in a single scan without contrast administration.

Accurate quantification of different compartments facilitates characterizing myocardial tissue in cardiac MRI. Although T1 mapping has emerged in the clinic, the use or value of T1 mapping for characterizing myocardial tissue has been questioned. Native T1 mapping, or T1 maps generated using the intrinsic relaxation parameters of the tissue, have shown to aid in the detection of edema, amyloidosis, lipid deposition, and siderosis. T1 mapping has also been performed after the injection of a gadolinium based contrast agent. This approach is referred to as post-contrast T1 mapping. Native T1 mapping and post-contrast T1 mapping have been used to produce maps and to quantify the ECV. However, these approaches may have been compromised by MRI image acquisition times (e.g., TR) that exceed magnetization exchange rates and by issues associated with contrast agent uptake.

Voxels in the myocardium are made up of different compartments. The compartments may include intracellular spaces and extracellular spaces. Contrast agent may infiltrate the extracellular space but not the intracellular space, which may cause different changes in T1 relaxation time. The different changes in T1 relaxation times may in turn reflect differences in different extracellular fractions. This ECV parameter may be calculated pixel-wise using both pre-contrast and post-contrast T1 maps assuming that the water protons in the two compartments exchange on a time-scale that is significantly faster than the T1 mapping experiment so that the composite signal evolution can be treated as an exponential made up of the weighted sum of the two sets of relaxation parameters for the individual compartments. However, exchange between the two pools may lead to inaccuracies in this model. Additionally, to calculate the volume fraction of extracellular water, this model requires collecting both pre-contrast and post-contrast T1 maps. A post-contrast T1 map requires the administration of gadolinium, which may be unacceptable for patients with kidney dysfunction at risk of nephrogenic systemic fibrosis. Thus, improvements in myocardial and other biologic imaging are sought.

Figure 5:
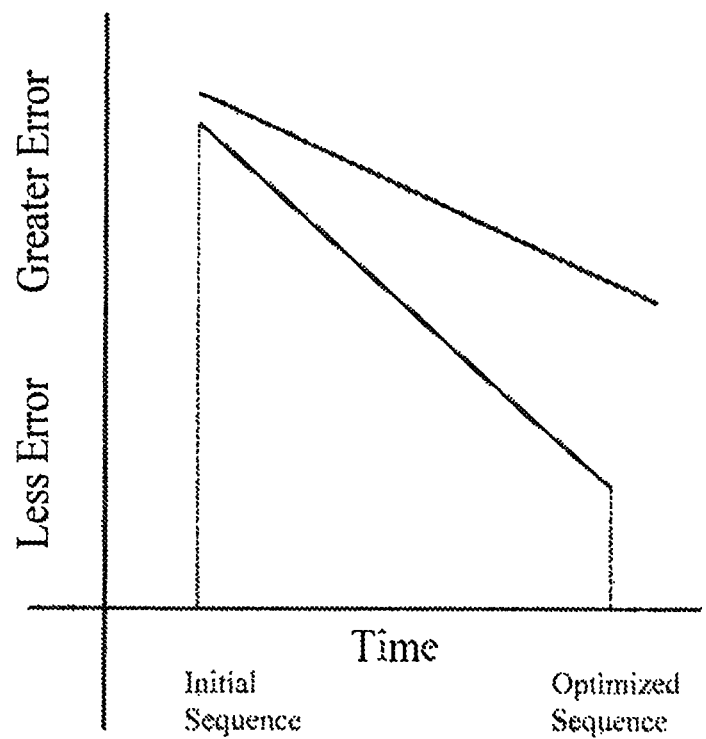
FIG. 5 illustrates percent errors in parameter maps.

FIG. 5 illustrates different rates of descent for errors during different optimization processes. In various embodiments, optimization of an MRF-X sequence can be performed. Optimizations may be designed to emphasize changes in the signal time courses due to volume fraction and exchange between compartments. The optimizations may be designed to improve parameter estimation or to reduce scan time. In one optimization experiment, sequence optimization was performed in a digital phantom using 20 images where each pixel had two compartments with an exchange rate of 8.3 s$^{-1}$ and volume fractions ranging from 0=100% in increments of 10%. A stochastic optimization method was used to find an optimal set of flip angles and repetition times. The stochastic optimization method was selected to rapidly sample multiple permutations of possible sequences. The optimization experiment mimics one theory of evolution where a population of individuals cross over and mutate on each iteration of the process. Individuals that minimize a cost function are more likely to survive to future iterations. In the optimization experiment, each iteration of the current MRF-X sequence was simulated using the Bloch-McConnell equations. The phantom images were gridded from Cartesian k-space. The resulting signal time courses were matched to a 5-dimensional dictionary to produce T1 maps of species A, T2 maps of species A, T1 maps of species B, T2 maps of species B, and volume fractions. The sum of the percent errors in the parameter maps was taken as the cost function. The percent errors in the parameter maps decreased by approximately 50% for the optimized sequence compared to the random initial sequence. Different optimization approaches yielded different rates of decrease.

Example apparatus and methods use MRF to cause resonant species in an object to produce pseudorandom MR signal evolutions. The pseudorandom signal evolutions may be compared to a dictionary of stored signal evolutions. The comparison may be performed using, for example, an orthogonal matching pursuit (OMP) technique. (See, e.g., Doneva M, et al. MRM, 2010) The stored signal evolutions may be from previous acquisitions or may even be from theoretical models. For example, the stored signal evolutions can be from a set described by:

$$SE = \sum_{i=1}^{N_S} \prod_{i=1}^{N_A} \sum_{j=1}^{N_{RF}} R_{i(\alpha)} R_{RF_{ij}(\alpha,\phi)} R(G) E_i(T1, T2, \ldots) DPdM_0 \quad [1]$$

or $$SE = \sum_{i=1}^{N_S} \prod_{i=1}^{N_A} \sum_{j=1}^{N_{RF}} R_i(\alpha) R_{RF_{ij}(\alpha,\phi)} R(G) E_i(T1, T2, \ldots) DPdM_0 \quad [2]$$

where:
SE is a signal evolution, $N_S$ is a number of spins, $N_A$ is a number of sequence blocks, $N_{RF}$ is a number of RF pulses in a sequence block, $\alpha$ is a flip angle, $\phi$ is a phase angle, $Ri(\alpha)$ is a rotation due to off resonance, $R_{RF_{ij}}(\alpha,\phi)$ is a rotation due to RF differences, $R(G)$ is a rotation due to a gradient, T1 is spin-lattice relaxation, T2 is spin-spin relaxation, D is diffusion relaxation, Pd is proton density, $E_i$(T1, T2, ... ) is decay due to relaxation differences, and $M_0$ is the default or equilibrium magnetization.

In one embodiment, the dictionary may store signal evolutions described by:

$$S_i = R_i E_i(S_{i-1}) \quad [3]$$

where:
$S_0$ is the default or equilibrium magnetization, $S_i$ is a vector that represents the different components of magnetization Mx, My, Mz during acquisition block i, $R_i$ is a combination of rotational effects that occur during acquisition block i, and $E_i$ is a combination of effects that alter the amount of magnetization in the different states for acquisition block i. In this embodiment, the signal at acquisition block i is a function of the previous signal at acquisition block i–1.

Additionally or alternatively, the dictionary may store signal evolutions described by:

$$S_i = R_i E_i \sum_{x=1}^{i-1} R_x E_x(S_x) \quad [4]$$

or $$S_i = R_i E_i \prod_{x=1}^{i-1} R_x E_x(S_x) \quad [5]$$

In this embodiment, the signal is a function of the current relaxation and rotation effects and of previous acquisitions. Additionally or alternatively, the dictionary may store signal evolutions described by:

$$S_i = \sum_{s=1}^{N_S} R_{s,i} E_{s,i}(S_{s,i-1}) \quad [6]$$

In this embodiment, voxels have multiple resonant species or spins in multiple compartments, and the effects may be different for every spin within a voxel. Additionally or alternatively, the dictionary may store signals described by:

$$S_i = \sum_{s=1}^{N_s} R_{s,i}E_{s,i} \sum_{x=1}^{i-1} R_{s,x}E_{s,x}(S_{s,x}) \quad [7]$$

or $$S_i = \sum_{s=1}^{N_s} R_{s,i}E_{s,i} \prod_{x=1}^{i-1} R_{s,x}E_{s,x}(S_{s,x}) \quad [8]$$

In this embodiment, voxels may have multiple resonant species or spins in multiple compartments, and the effects may be different for spins within a voxel, and thus the signal may be a function of the effects and the previous acquisition blocks. However, the set of known signal evolutions may include specially crafted signal evolutions as described herein. The set of equations [1]-[8] may be referred to collectively as the MRF dictionary equations.

Some MRF investigations may involve a sample for which there is a priori knowledge about the resonant species that are likely to be encountered and/or the compartmentalization exchange rate and ECV of the biologic tissue in which the resonant species will be found. The a priori knowledge may even include information concerning possible or expected ratios of the amounts of the resonant species to be encountered in the sample. When the sample has some properties (e.g., T1 relaxation time, T2 relaxation time) that are likely to fall in a certain range, then it may be possible to simplify or even focus the pattern matching portion of MRF.

MRF involves measuring pseudorandom MR signal evolutions produced in response to MRF pulse sequences. MRF also includes generating modeled signal evolutions that may be stored in a dictionary. The dictionary entries may be a function of several parameters. If the composition or compartmentalization of the sample to be interrogated is known ahead of time, then a mathematical operation (e.g., weighted sum) of dictionary entries corresponding to the known components may be used to model signal evolutions and an inverse mathematical operation (e.g., matrix pseudo-inverse) may be used to compute the relative fraction of components assumed to be present based on a received signal evolution.

MRF simultaneously provides quantitative data concerning multiple MR parameters. Observed signal evolutions are matched to dictionary entries using, for example, template matching or other matching or comparing processes. In one example matching process, the inner product is computed between a noisy acquired signal and entries in a dictionary to find the stored signal evolution to which an acquired signal evolution most closely matches. In other examples, other pattern matching or similarity finding approaches are performed. Values related to the dictionary entry that matched the acquired noisy signal may then be retrieved. In one example, the values may be stored in the dictionary, while in another example MR parameters may be stored in a data store separate from the dictionary. In one embodiment, the values may be retrieved by performing a mathematical operation on a signal evolution.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware or firmware and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

Figure 6:
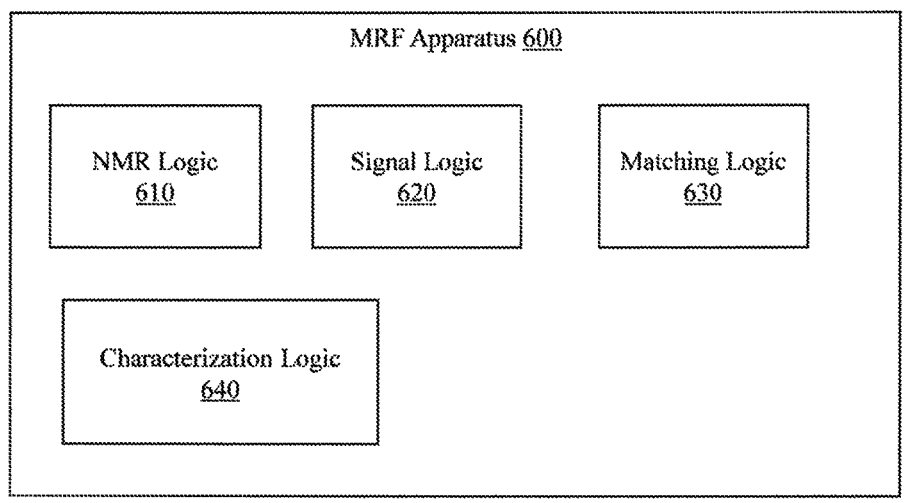
FIG. 6 illustrates an example magnetic resonance (MR) apparatus associated with multi-component voxel separation using MRF-X.

FIG. 6 illustrates an MRF apparatus 600. MRF apparatus 600 may, for example, be part of a Siemens 3T Skyra scanner having 32 receive channels. MRF apparatus 600 may simultaneously quantify MR parameters including T1 and T2 for an object to which an MRF pulse sequence is applied. MRF apparatus 600 may be configured to perform MRF-X and thus to quantify T1 and T2 values for voxels having multiple components or compartments that may experience magnetic exchange. In one embodiment, MRF-X performs subvoxel mapping of T1 and volume fraction in voxels with multiple pools of exchanging magnetization. In one embodiment, MRF-X facilitates directly measuring properties of tissue microstructure.

MRF apparatus 600 includes an NMR logic 610. In one embodiment, the NMR logic 610 applies RF energy to the object according to an MRF pulse sequence. NMR logic 610 repetitively and variably samples the object in a (k, t, E) space to acquire a first set of data. The first set of data may be a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner. The first set of data may have contributions of NMR signals from different resonant species in different compartments in the sample that produced the first set of data. Apparatus 600 facilitates producing quantitative data concerning the different resonant species in the different compartments in the sample. The multiple compartments may experience magnetic exchange.

MRF apparatus 600 also includes a signal logic 620. Signal logic 620 produces an NMR signal evolution from the acquired NMR signals. The signal evolution may include a number of NMR signals acquired over a period of time. The signal evolution may have contributions from the different resonant species in the different compartments. Different amounts of resonant species in different compartments in a sample may cause different signal evolutions to be produced.

MRF apparatus 600 also includes a matching logic 630. Matching logic 630 compares the produced NMR signal evolution or information associated with the produced NMR signal evolution to a collection (e.g., dictionary, database) of stored signal evolutions to find a match for the acquired NMR signal evolution. The matching logic 630 may perform a match for a signal evolution associated with each pixel or voxel examined. In one embodiment, information concerning the ECV of a biologic tissue from which the signal evolution is acquired may be determined. Matching logic 630 selects, from a collection of stored signal evolutions, a selected stored signal evolution that matches the NMR signal evolution to within a desired tolerance. Matching logic 630 retrieves quantitative information about an MR parameter associated with a member of the plurality of compartments or the magnetic exchange between members of the plurality of compartments based, at least in part, on the selected stored signal evolution.

"Match" as used herein refers to the result of comparing signals. "Match" does not refer to an exact match, which may or may not be found. A match may be the signal that most closely resembles another signal. A match may be the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease, normal, abnormal). The reference information may include signal evolutions that are formed from combinations of resonant species with combinations of MR parameters. The reference information may include signal evolutions associated with different exchange rates, ECVs, or combinations thereof.

Apparatus 600 also includes a characterization logic 640 that retrieves quantitative information that facilitates understanding whether the object has resonant species exhibiting first attributes that fall within a first specified range, or whether members of the plurality of compartments exhibit a second attribute that falls within a second specified range. In one embodiment, MRF apparatus 600 may produce an image from the quantitative information. The image may be, for example, a T1 weighted image, a T2 weighted image, a proton density image, a volume fraction image, or other image.

Figure 7:
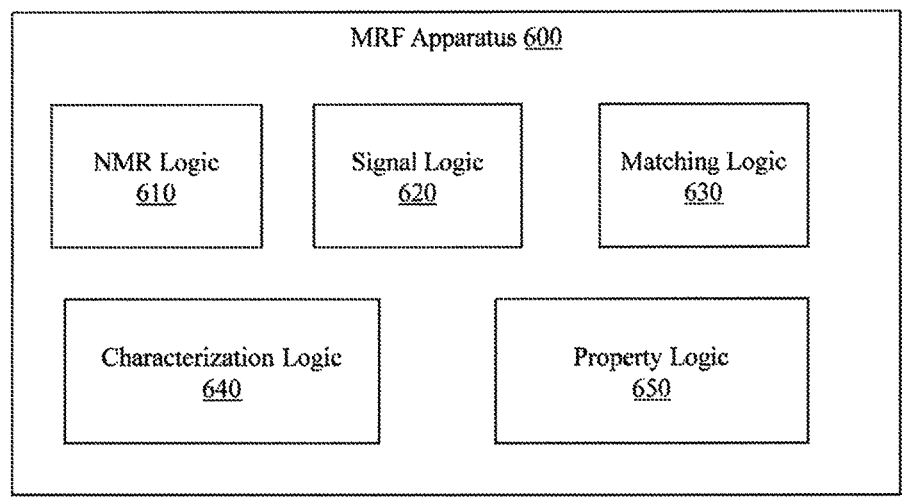
FIG. 7 illustrates an example MR apparatus associated with multi-component voxel separation using MRF-X.

FIG. 7 illustrates another embodiment of apparatus 600. This embodiment also includes a property logic 650. Property logic 650 identifies the object as having a property based, at least in part, on the quantitative information. The property may describe, for example, whether the object is diseased or healthy, whether the object has T1, T2, or other parameters that fall within a normal range or that fall outside a normal range, or other properties. In one embodiment, the property may indicate a myocardial pathology or condition (e.g., fibrotic disease, edema, amyloidosis, lipid deposition, siderosis). While property logic 650 is illustrated as being part of MRF apparatus 600, in one embodiment, the property logic 650 may reside in an apparatus separate from the MRF apparatus 600.

Figure 8:
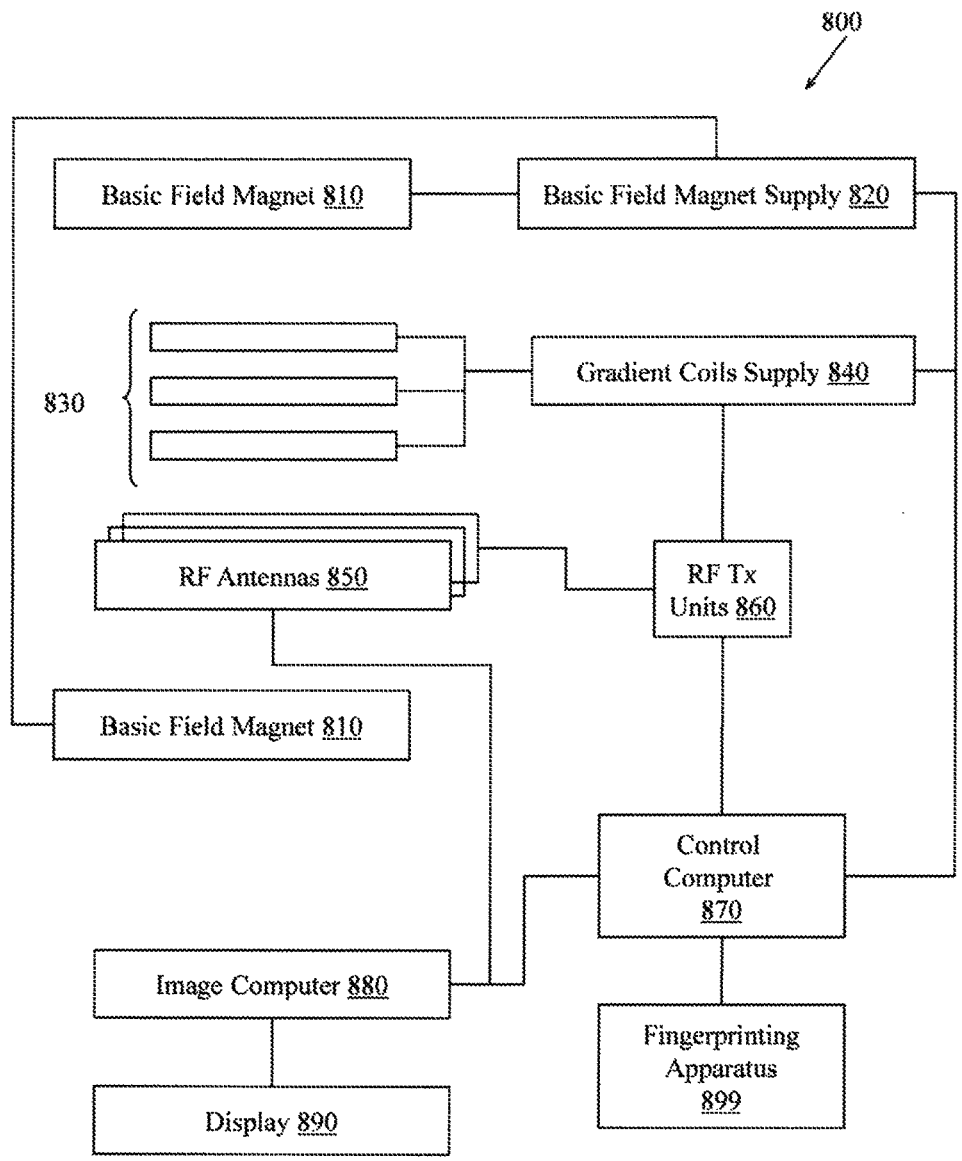
FIG. 8 illustrates an example MR apparatus associated with multi-component voxel separation using MRF-X.

FIG. 8 illustrates an example MR apparatus 800 having a fingerprinting apparatus 899 that facilitates MRF associated with multi-component voxel separation with compartment exchange. The fingerprinting apparatus 899 may be configured with elements of example apparatus described herein or may perform example methods described herein. While fingerprinting apparatus 899 is illustrated as part of MR apparatus 800, in one example, fingerprinting apparatus 899 may be a separate apparatus or apparatuses.

In one embodiment, fingerprinting apparatus 899 may include a collection logic that collects a received signal evolution from a tissue experiencing NMR in response to an MRF excitation applied to the tissue by the MRI apparatus 800. Fingerprinting apparatus 899 may also include a data store that stores a dictionary of MRF signal evolutions. Unlike conventional systems, members of the dictionary may be specially crafted combinations of constrained information associated with two or more resonant species or with voxels having multiple compartments that may experience magnetic exchange. Information concerning the composition of the tissue is retrievable using a matched signal evolution. The fingerprinting apparatus 899 may also include a selection logic that selects a matching member of the dictionary that is most closely related to the signal evolution and establishes the matching member as the matched signal evolution. Fingerprinting apparatus 899 may also include a characterization logic that identifies a category for the tissue based, at least in part, on the composition of the tissue as identified using the matched signal evolution. The characterization logic may identify the category for the tissue using a quantitative magnetic resonance based approach. The category for the tissue may distinguish tissue exhibiting T1 and T2 parameters that are within an expected range from tissue exhibiting T1 and T2 parameters that are outside an expected range.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 that emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

Fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available.

In one embodiment, fingerprinting apparatus 899 may include a circuit that controls MRI apparatus 800 to apply an MRF-X pulse sequence to a biologic tissue having a cell with an intracellular volume and an extracellular volume. The intracellular volume and the extracellular volume experience magnetic exchange due to water movement between the intracellular volume and the extracellular volume. The circuit may control the MRI apparatus 800 to apply an MRF-X pulse sequence that has flip angles that vary pseudorandomly in a range of zero degrees to seventy degrees, that has acquisition times that vary pseudorandomly in a range of 9 ms to 12 ms, or that vary in other ways.

Fingerprinting apparatus 899 may also include a circuit that acquires NMR resulting from applying the MRF-X pulse sequence to the biologic tissue and a circuit that matches the acquired NMR to a selected entry in an MRF-X dictionary. Fingerprinting apparatus 899 may include another circuit that quantifies T1 for the intracellular volume or T1 for the extracellular volume based, at least in part, on the selected entry. Additionally, or alternatively, fingerprinting apparatus 899 may include a circuit that quantifies T2 for the intracellular volume or T2 for the extracellular volume based, at least in part, on the selected entry. Additionally, or alternatively, fingerprinting apparatus 899 may include a circuit that quantifies an extracellular volume for the biologic tissue based, at least in part, on the selected entry.

Fingerprinting apparatus 899 may include a circuit that produces an image of a portion of the cell based, at least in part, on the selected entry. The circuit may interact with the image computer 880 or the display 890. The image may illustrate different information including, for example, T1 for the intracellular volume, T1 for the extracellular volume, T2 for the intracellular volume, T2 for the extracellular volume, an extracellular volume for the biologic tissue, or other information.

While FIG. 8 illustrates an example MR apparatus 800 that includes various components connected in various ways, it is to be appreciated that other MR apparatus may include other components connected in other ways.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 9:
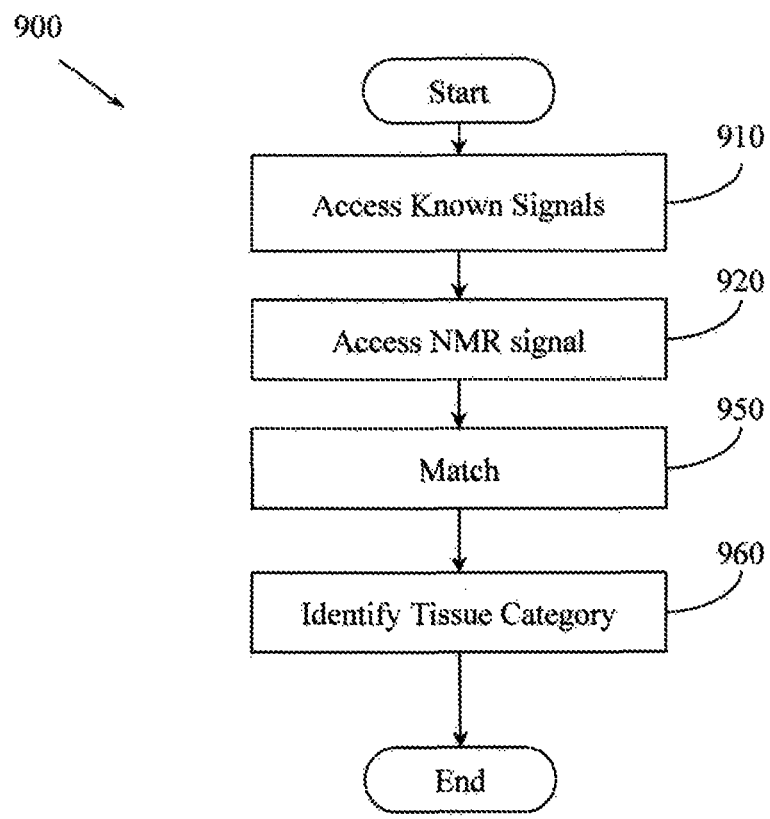
FIG. 9 illustrates an example method associated with multi-component voxel separation using MRF-X.

FIG. 9 illustrates a method 900 associated with MRF-X based multi-component voxel separation with compartment exchange. Method 900 includes, at 910, accessing a set of known MRF-X signal evolutions. Unlike conventional systems, a member of the set of known MRF signal evolutions may have been produced by combining constrained data associated with NMR signals associated with a plurality of selected resonant species that may be found in biologic tissue having multiple compartments (e.g., intracellular space, extracellular space) that experience magnetic exchange. In one embodiment, combining the data involves using a forward operation (e.g., weighted sum) for which an inverse operation (e.g., matrix pseudo-inverse) that identifies relative fractions of resonant species associated with the member is available.

Method 900 also includes, at 920, accessing an acquired NMR signal that was produced by a volume in response to MRF excitation produced by an MRF-X pulse sequence applied to the volume. The volume includes a first sub-volume and a second sub-volume that simultaneously produced individual NMR signals in response to the MRF-X pulse sequence. The acquired NMR signal may be acquired even while magnetic exchange occurs between the first sub-volume and the second sub-volume. In one embodiment, the MRF-X pulse sequence is an MRF with fast imaging with steady state precession (MRF-FISP) pulse sequence having acquisition times that vary in a range from 5 ms to less than 20 ms. In one embodiment, the MRF-X pulse sequence is an MRF-FISP pulse sequence having flip angles that vary in a range from 0 degrees to 70 degrees. In one embodiment, the MRF-X pulse sequence is an MRF-FISP pulse sequence having flip angles that vary in a range from 0 degrees to 70 degrees and having acquisition times that vary in a range from 9 ms to 12 ms.

Method 900 also includes, at 950, matching the acquired NMR signal to provide quantitative data about the resonant species in the different compartments in the volume. Once the acquired NMR signal has been matched, method 900 includes determining a quantitative value for an MR parameter associated with the first sub-volume based, at least in part, on the acquired NMR signal. In one embodiment, method 900 also includes determining a quantitative value for an MR parameter associated with the second sub-volume based, at least in part, on the acquired NMR signal. The MR parameter associated with the first sub-volume may be, for example, T1, T1 being spin-lattice relaxation or T2, T2 being spin-spin relaxation. Similarly, the MR parameter associated with the second sub-volume may be T1 or T2.

In one embodiment, method 900 may include determining a property of the volume based, at least in part, on the quantitative value for the MR parameter associated with the first sub-volume and/or the quantitative value for the MR parameter associated with the second sub-volume. In one embodiment, method 900 also includes, at 960, identifying the volume as containing tissue that is a member of a tissue category. The tissue category may be selected based, at least in part, on the quantitative values for the sub-volumes or the property of the volume. In one embodiment, the tissue category may identify whether the tissue is exhibiting properties that are within an expected range or that are outside the expected range. The tissue category may be, for example, healthy tissue or diseased tissue. In one embodiment, the first sub-volume may be an intracellular space in a biologic tissue and the second sub-volume may be an extracellular space in the biologic tissue. The biologic tissue may be, for example myocardial tissue. Thus, in one embodiment, the tissue category may be myocardial tissue exhibiting fibrotic disease, myocardial tissue exhibiting edema, myocardial tissue exhibiting amyloidosis, myocardial tissue exhibiting lipid deposition, or myocardial tissue exhibiting siderosis.

The stored signals and information derived from reference signal evolutions may be associated with a potentially very large data space. The data space for signal evolutions can be partially described by members of the MRF dictionary equations. In one embodiment, the MRF dictionary equations may be used to produce a five parameter dictionary that models $T1_{intra}$, $T2_{intra}$, $T1_{extra}$, $T2_{extra}$, and volume fraction, where $T1_{intra}$ refers to T1 relaxation when the first sub-volume is an intracellular space, $T2_{intra}$ refers to T2 relaxation when the first sub-volume is the intracellular space, $T1_{extra}$ refers to T1 relaxation when the second sub-volume is an extracellular space, and $T2_{extra}$ refers to T2 relaxation when the second sub-volume is the extracellular space. Other dictionary entries with other numbers of parameters may be employed.

While FIG. 9 illustrates various actions occurring in serial, it is to be appreciated that various actions illustrated in FIG. 9 could occur substantially in parallel. By way of illustration, a first process could control accessing known signals, a second process could control acquiring NMR signals and a third process could identify the volume as containing tissue that is exhibiting properties within an expected range. While three processes are described, it is to be appreciated that a greater and/or lesser number of processes could be employed.

Figure 10:
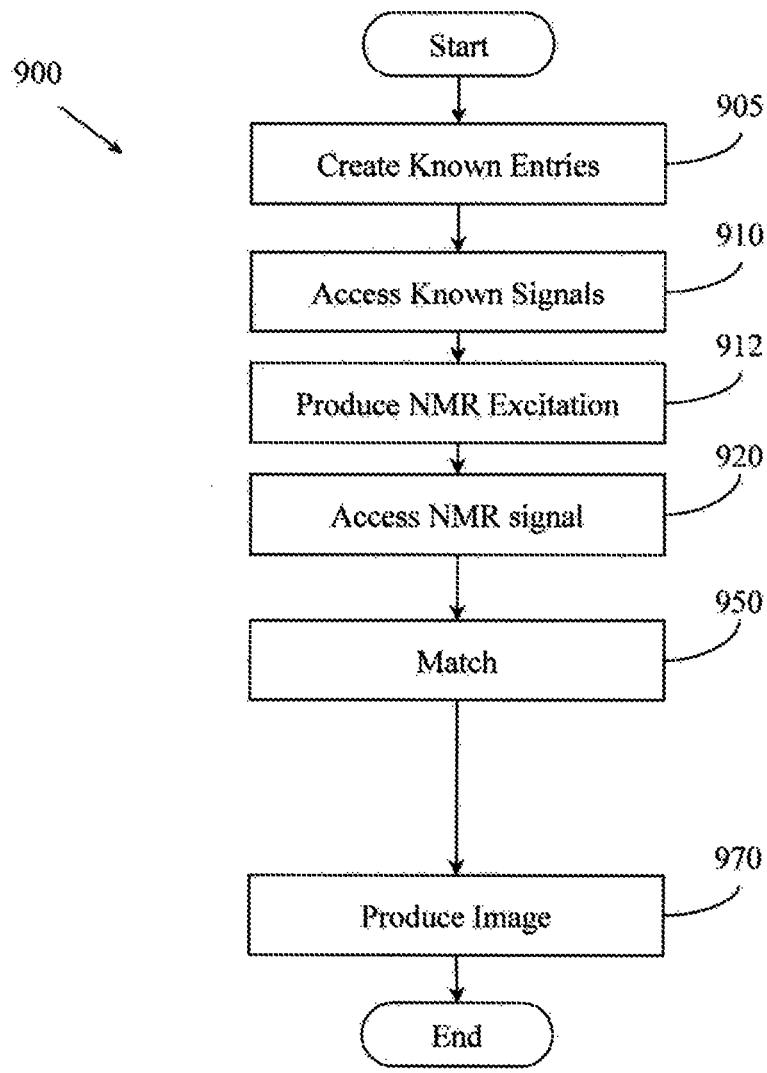
FIG. 10 illustrates an example method associated with multi-component voxel separation using MRF-X.

FIG. 10 illustrates another embodiment of method 900 (FIG. 9). This embodiment includes actions 910, 920, 950, and 960. However, this embodiment also includes actions 905, 912, and 970. Action 905 includes creating the collection of stored entries or producing the set of known MRF-X signal evolutions. Producing the set of known MRF signal evolutions may include combining, using a weighted sum operation, data associated with NMR signals associated with two or more resonant species in voxels having multiple compartments experiencing magnetic exchange. In this embodiment, the inverse operation may be a matrix pseudo-inverse operation.

In one embodiment, producing the set of known MRF-X signal evolutions may include producing a signal evolution using a Bloch-McConnell equation. In one embodiment, producing the set of known MRF-X signal evolutions may include producing a plurality of signal evolutions that account for an extracellular volume range of zero percent to one hundred percent, or producing a plurality of signal evolutions that account for an exchange rate range of $5.0\ s^{-1}$ to $1000\ s^{-1}$. In one embodiment, producing the set of known MRF-X signal evolutions may include producing a plurality of signal evolutions that account for at least five parameters including $T1_{intra}$, $T2_{intra}$, $T1_{extra}$, $T2_{extra}$, and volume fraction. Signal evolutions associated with a greater or lesser number of parameters may be employed.

In one embodiment, producing the set of known MRF signal evolutions at 905 includes producing data associated with NMR signals by constraining first and second MR parameters associated with different resonant species in multiple compartments experiencing magnetic exchange between the compartments. In one embodiment, producing the data includes varying a first MR parameter associated with a first resonant species contributing to the NMR signals while holding constant a second MR parameter associated with a second resonant species contributing to the NMR signals. In one embodiment, holding a parameter constant may include allowing the parameter to vary within a tight range (e.g., 1%, 5%) around a central value. The parameters may include T1 and T2. The first resonant species may include, for example, cells experiencing one type of magnetic exchange. The second resonant species may include, for example, cells experiencing a different type of magnetic exchange.

Figure 11:
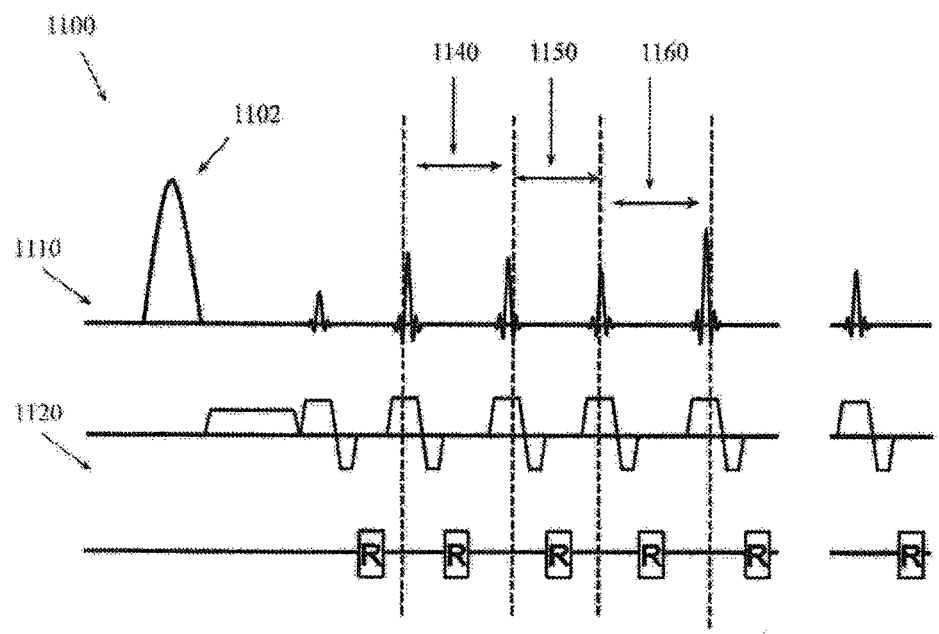
FIG. 11 illustrates an example magnetic resonance fingerprinting (MRF) pulse sequence.
Figure 12:
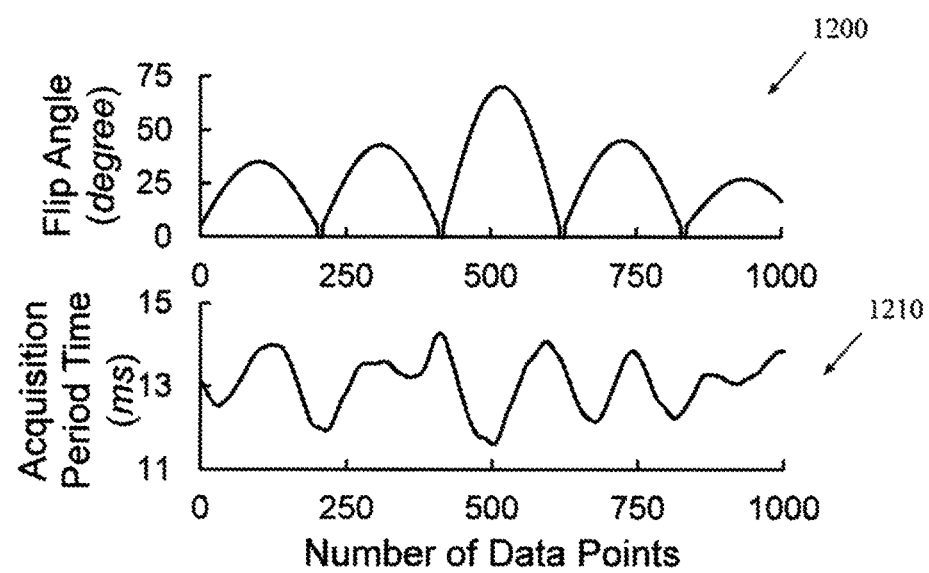
FIG. 12 illustrates example flip angles and acquisition times associated with an example MRF pulse sequence.
Figure 13:
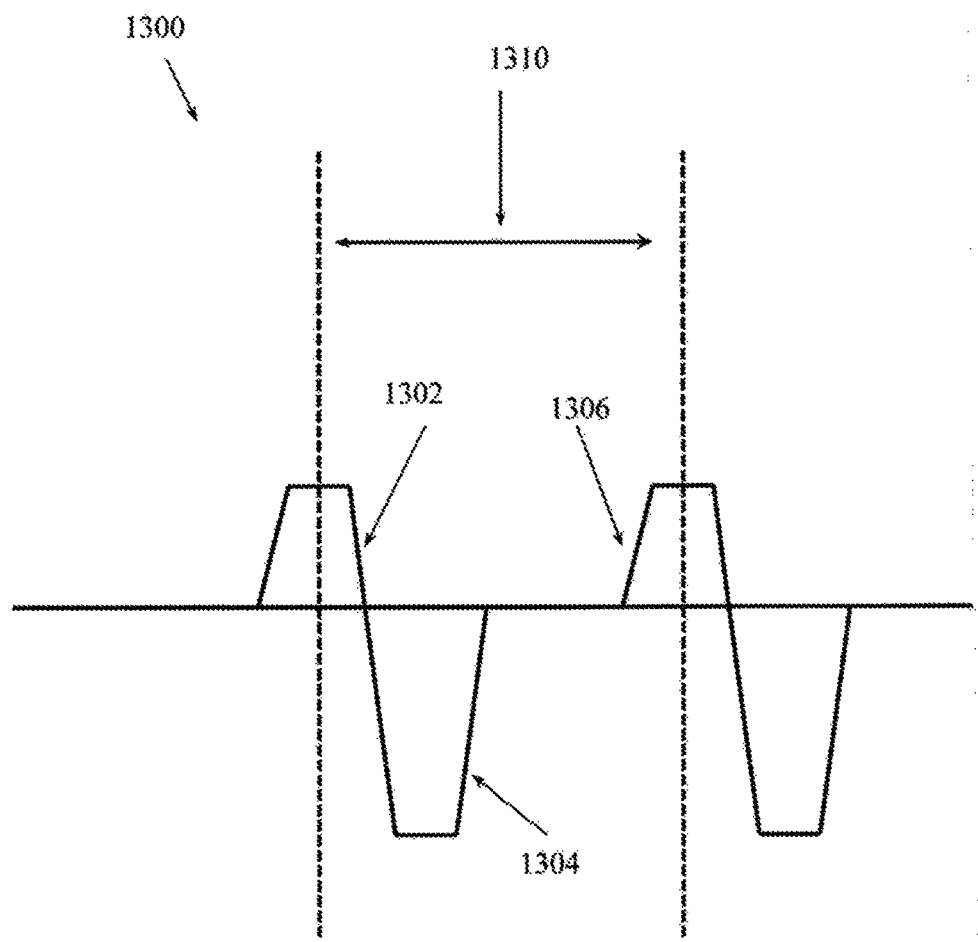
FIG. 13 illustrates a portion of an example MRF pulse sequence.

Action 912 includes controlling the MRF apparatus to produce the MRF excitation using an MRF pulse sequence. Producing the MRF excitation is performed by applying RF energy to the volume in the object in a series of variable sequence blocks. Recall that an MRF sequence block includes one or more excitation phases, one or more readout phases, and one or more waiting phases. Recall also that at least one member of the series of variable sequence blocks differs from at least one other member of the series of variable sequence blocks in one or more sequence block parameters. Example fast imaging with steady state precession (FISP) pulse sequences, which may be referred to as MRF-FISP pulse sequences, are illustrated in FIGS. 11-13.

In one embodiment, action 912 includes controlling the NMR apparatus to vary a flip angle associated with the MRF pulse sequence or to vary the acquisition period in the MRF pulse sequence. In one embodiment, the flip angle may be controlled to vary pseudorandomly between 0-70 degrees and the acquisition period may be controlled to vary pseudorandomly between 8 ms and 12 ms. Other ranges of flip angles and acquisition periods may be employed. Action 912 may also include varying other sequence block parameters including, but not limited to, echo time, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, number of gradients applied during a readout portion of a sequence block, amount of RF spoiling, or an amount of gradient spoiling.

Action 912 may also include controlling the MRF apparatus to vary the amount of time between sequence blocks in the series of variable sequence blocks, the relative amplitude of RF pulses in sequence blocks in the series of variable sequence blocks, or the relative phase of RF pulses in sequence blocks in the series of variable sequence blocks.

This embodiment of method 900 also includes, at 970, producing an image. The image may be a T1 weighted image, a T2 weighted image, a proton density image map, or other image. The image may be based, at least in part, on quantitative values associated with the selected entry. The information may include, for example, a diagnosis or categorization.

Producing the image at 970 may include producing an image of a portion of the volume based, at least in part, on the quantitative value associated with the first sub-volume. Producing the image at 970 may, additionally or alternatively, include producing an image of a portion of the volume based, at least in part, on the quantitative value associated with the second sub-volume.

Example apparatus and methods simultaneously acquire quantitative data concerning MR parameters for resonant species in an object using MRF. FIG. 11 illustrates an example MRF-FISP pulse sequence 1100. The MRF-FISP pulse sequence 1100 includes a RF inversion pulse 1102 in the RF energy 1110 applied. While an inversion pulse 1102 is illustrated, in different embodiments there may or may not be an inversion recovery period. The MRF-FISP pulse sequence 1100 includes an unbalanced slice select gradient 1120. While slice select gradient 1120 is illustrated as being unbalanced, in different embodiments other gradients (e.g., x, y, z, phase encoding, frequency encoding, readout encoding) may be unbalanced. The unbalanced slice select gradient 1120 dephases transverse magnetization produced during MRF of the object. In one embodiment, other than T2 or T2\* decay, only the unbalanced slice select gradient 1120 dephases the transverse magnetization. Controlling the dephasing of transverse magnetization in this manner improves immunity to artifacts or other distortions caused by an imperfect B0. In the MRF-FISP pulse sequence 1100, the acquisition periods 1140, 1150, and 1160 do not have to be of equal duration. However, in one preferred embodiment, the acquisition periods 1140, 1150, and 1160 will be equal. While an MRF-FISP sequence 1100 is illustrated, example apparatus and methods may employ other MRF pulse sequences.

FIG. 13 illustrates a portion of an MRF-FISP pulse sequence 1300. One acquisition period 1310 is illustrated. The area 1302 usually cancels the area 1304 leaving the area 1306 as residual.

The MRF-FISP algorithm can be manipulated to generate different contrasts by varying flip angles or acquisition periods used in the MRF-FISP pulse sequence 1100. Thus, in one embodiment, to generate unique signal shapes for different tissue types that may be examined using MRF-FISP, example apparatus and methods may vary flip angle or acquisition time in different acquisition periods. In one embodiment, a flip angle or repetition time may be varied from one acquisition period to the next.

FIG. 12 illustrates one example manipulation of flip angle 1200 and acquisition time 1210 in an example MRF-FISP pulse sequence. In one embodiment, a sinusoidal variation of flip angles and acquisition times per acquisition period may be employed in a Perlin noise pattern.

The unbalanced gradient 1120 illustrated in FIG. 11 in pulse sequence 1100, combined with the variations in flip angle 1200 and acquisition period 1210 illustrated in FIG. 12 produced $2\pi$ dephasing within one voxel. Achieving $2\pi$ dephasing or more within one voxel makes data acquired using the MRF-FISP sequence insensitive to B0 inhomogeneity. While $2\pi$ dephasing is described, other dephasing (e.g., $8\pi$) may be employed.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is inclusive in a manner similar to the term "comprising" as that term is interpreted when employed as a transitional word in a claim.

To the extent that the term "or" is employed in the detailed description or claims (e.g., A or B) it means "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A method for performing magnetic resonance fingerprinting (MRF) using an nuclear magnetic resonance (NMR) apparatus, the method comprising:
    accessing a set of known magnetic resonance fingerprinting signal evolutions;
    acquiring an NMR signal from a volume using the NMR apparatus to perform a pulse sequence, where the volume includes a first sub-volume and a second sub-volume that simultaneously produces individual NMR signals responsive to the pulse sequence, and where magnetic exchange occurs between the first sub-volume and the second sub-volume;
    matching the acquired NMR signal to a selected entry within the set of known signal evolutions; and
    determining a quantitative value for a magnetic resonance (MR) parameter associated with the first sub-volume based, at least in part, on the acquired NMR signal.

2. The method of claim 1 further comprising:
    determining a quantitative value for an MR parameter associated with the second sub-volume based, at least in part, on the acquired NMR signal.

3. The method of claim 2, where the first sub-volume is an intracellular space in a biologic tissue and the second sub-volume is an extracellular space in the biologic tissue.

4. The method of claim 3, where the biologic tissue is myocardial tissue.

5. The method of claim 3 further comprising producing the set of known MRF-X signal evolutions.

6. The method of claim 5, where producing the set of known MRF-X signal evolutions includes producing a signal evolution using a Bloch-McConnell equation.

7. The method of claim 5, where producing the set of known MRF-X signal evolutions includes producing a plurality of signal evolutions that account for an extracellular volume range of zero percent to one hundred percent.

8. The method of claim 7, where producing the set of known MRF-X signal evolutions includes producing a plurality of signal evolutions that account for an exchange rate range of $5.0\ s^{-1}$ to $1000\ s^{-1}$.

9. The method of claim 5, where producing the set of known MRF-X signal evolutions includes producing a plurality of signal evolutions that account for at least five parameters including $T1_{intra}$, $T2_{intra}$, $T1_{extra}$, $T2_{extra}$, and volume fraction, where:

$T1_{intra}$ refers to T1 relaxation when the first sub-volume is an intracellular space, $T2_{intra}$ refers to T2 relaxation when the first sub-volume is the intracellular space, $T1_{extra}$ refers to T1 relaxation when the second sub-volume is an extracellular space, and $T2_{extra}$ refers to T2 relaxation when the second sub-volume is the extracellular space.

10. The method of claim 2, where the MR parameter associated with the second sub-volume is T1, T1 being spin-lattice relaxation or T2, T2 being spin-spin relaxation.

11. The method of claim 2, the method comprising:
determining a property of the volume based, at least in part, on the quantitative value for the MR parameter associated with the first sub-volume or the quantitative value for the MR parameter associated with the second sub-volume.

12. The method of claim 2 further comprising:
identifying the volume as containing tissue that is a member of a tissue category based, at least in part, on the quantitative value associated with the first sub-volume or the quantitative value associated with the second sub-volume, and
providing information concerning the tissue category.

13. The method of claim 12, where the tissue category is one of, tissue exhibiting quantitative values within a range, and tissue exhibiting quantitative values outside the range.

14. The method of claim 12, where the tissue category is myocardial tissue exhibiting fibrotic disease, myocardial tissue exhibiting edema, myocardial tissue exhibiting amyloidosis, myocardial tissue exhibiting lipid deposition, or myocardial tissue exhibiting siderosis.

15. The method of claim 2 further comprising producing an image of a portion of the volume based, at least in part, on the quantitative value associated with the second sub-volume.

16. The method of claim 2 further comprising producing an image of a portion of the volume based, at least in part, on the quantitative value associated with the first sub-volume and the quantitative value associated with the second sub-volume.

17. The method of claim 1, where the MR parameter associated with the first sub-volume is T1, T1 being spin-lattice relaxation or T2, T2 being spin-spin relaxation.

18. The method of claim 1 where the pulse sequence is an MRF with fast imaging with steady state precession (MRF-FISP) pulse sequence having acquisition times that vary in a range from 5 ms to less than 20 ms.

19. The method of claim 1, where the pulse sequence is an MRF with fast imaging with steady state precession (MRF-FISP) pulse sequence having flip angles that vary in a range from 0 degrees to 70 degrees.

20. The method of claim 1, where the pulse sequence is an MRF with fast imaging with steady state precession (MRF-FISP) pulse sequence having flip angles that vary in a range from 0 degrees to 70 degrees and having acquisition times that vary in a range from 9 ms to 12 ms.

21. The method of claim 1 further comprising:
controlling MRF apparatus to produce the MRF excitation using the pulse sequence by applying radio frequency (RF) energy to the volume in a series of variable sequence blocks, where a sequence block includes one or more excitation phases, one or more readout phases, and one or more waiting phases,
where the RF energy applied during a sequence block causes the one or more resonant species in the first sub-volume and the second sub-volume to simultaneously produce individual NMR signals, and
where at least one member of the series of variable sequence blocks differs from at least one other member of the series of variable sequence blocks, and
controlling the MRF apparatus to acquire the simultaneously produced individual NMR signals.

22. The method of claim 21, where the sequence block parameters include echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, or an amount of gradient spoiling.

23. The method of claim 22 further comprising:
controlling the MRF apparatus to vary an amount of time between sequence blocks in the series of variable sequence blocks, the relative amplitude of RF pulses in sequence blocks in the series of variable sequence blocks, or the relative phase of RF pulses in sequence blocks in the series of variable sequence blocks.

24. The method of claim 1, where the set of known signal evolutions includes signal evolutions outside the set of signal evolutions characterized by:

$$SE = A - Be^{-t/C}$$

where:
SE is a signal evolution,
A is a constant,
B is a constant,
t is time, and
C is a single relaxation parameter.

25. The method of claim 1, where the set of known signal evolutions includes a signal selected from a set of signals described by a member of the MRF dictionary equations.

26. The method of claim 1 further comprising producing an image of a portion of the volume based, at least in part, on the quantitative value associated with the first sub-volume.

27. An apparatus, comprising:
a nuclear magnetic resonance (NMR) logic that receives a first set of data from a magnetic resonance fingerprinting (MRF) apparatus that repetitively and variably samples a (k, t, E) space associated with an object to acquire a set of NMR signals, where the object has voxels that includes a plurality of compartments that may experience magnetic exchange between the compartments,
where the MRF apparatus applies radio frequency (RF) energy to the object according to an MRF pulse sequence to cause the object to produce the set of NMR signals,
where members of the first set of data are associated with different points in the {k, t, E} space, where t is time and E includes at least T1 and T2, T1 being spin-lattice relaxation and T2 being spin-spin relaxation, and
where one or more of, t and E, vary non-linearly;
a signal logic that produces an NMR signal evolution from the first set of data; and
a matching logic that selects, from a collection of stored signal evolutions,
a selected stored signal evolution that matches the NMR signal evolution to within a desired tolerance, and retrieves quantitative information about a magnetic resonance (MR) parameter associated with a member of the plurality of compartments or the magnetic exchange between members of the plurality of compartments based, at least in part, on the selected stored signal evolution.

28. The apparatus of claim 27, comprising:
a characterization logic that retrieves the quantitative information and identifies the object as having a property based, at least in part, on the quantitative information,
where the property describes whether the object has resonant species exhibiting first attributes that fall within a first specified range, or
where the property describes whether a member of the plurality of compartments exhibits a second attribute that falls within a second specified range.

29. An apparatus, comprising:
a circuit that controls a magnetic resonance imaging (MRI) apparatus to apply a magnetic resonance fingerprinting with exchange (MRF-X) pulse sequence to a biologic tissue having a cell with an intracellular volume and an extracellular volume, where the intracellular volume and the extracellular volume experience magnetic exchange due to water movement between the intracellular volume and the extracellular volume;
a circuit that acquires nuclear magnetic resonance (NMR) resulting from applying the MRF-X pulse sequence to the biologic tissue;
a circuit that matches the acquired NMR to a selected entry in an MRF-X dictionary; and
a circuit that quantifies T1 for the intracellular volume or T1 for the extracellular volume based, at least in part, on the selected entry.

30. The apparatus of claim 29, comprising:
a circuit that quantifies T2 for the intracellular volume or T2 for the extracellular volume based, at least in part, on the selected entry.

31. The apparatus of claim 30, comprising:
a circuit that quantifies an extracellular volume for the biologic tissue based, at least in part, on the selected entry.

32. The apparatus of claim 29, where the MRF-X pulse sequence has flip angles that vary pseudorandomly in a range of zero degrees to seventy degrees.

33. The apparatus of claim 29, where the MRF-X pulse sequence has acquisition times that vary pseudorandomly in a range of 9 ms to 12 ms.

34. The apparatus of claim 29, comprising a circuit that produces an image of a portion of the cell based, at least in part, on the selected entry.

35. The apparatus of claim 34, where the image illustrates T1 for the intracellular volume or T1 for the extracellular volume.

36. The apparatus of claim 34, where the image illustrates T2 for the intracellular volume or T2 for the extracellular volume.

37. The apparatus of claim 34, where the image illustrates an extracellular volume for the biologic tissue.

* * * * *